(12) United States Patent
Williams et al.

(10) Patent No.: US 8,975,753 B2
(45) Date of Patent: Mar. 10, 2015

(54) THREE DIMENSIONAL INTERCONNECT STRUCTURE AND METHOD THEREOF

(75) Inventors: Charles Kenneth Williams, Raleigh, NC (US); Christopher A. Bower, Raleigh, NC (US); Dean Michael Malta, Cary, NC (US); Dorota Temple, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 764 days.

(21) Appl. No.: 13/202,187

(22) PCT Filed: Mar. 3, 2010

(86) PCT No.: PCT/US2010/025987
§ 371 (c)(1),
(2), (4) Date: Aug. 18, 2011

(87) PCT Pub. No.: WO2010/114662
PCT Pub. Date: Oct. 7, 2010

(65) Prior Publication Data
US 2011/0298134 A1    Dec. 8, 2011

Related U.S. Application Data

(60) Provisional application No. 61/166,388, filed on Apr. 3, 2009.

(51) Int. Cl.
*H01L 23/52* (2006.01)
*H01L 23/48* (2006.01)
(Continued)

(52) U.S. Cl.
CPC ...... *H01L 21/76898* (2013.01); *H01L 25/0657* (2013.01); *H01L 25/50* (2013.01);
(Continued)

(58) Field of Classification Search
CPC ......... H01L 24/02; H01L 24/81; H01L 24/94; H01L 25/50; H01L 25/0657
USPC ................... 257/774, 777, E23.145, E23.011
See application file for complete search history.

(56) References Cited

U.S. PATENT DOCUMENTS 5,514,622 A * 5/1996 Bornstein et al. ............. 438/628
5,608,264 A * 3/1997 Gaul ............................. 257/734
(Continued)

OTHER PUBLICATIONS

International Search Report issued May 11, 2010 in PCT/US10/025987 filed Mar. 3, 2010.

*Primary Examiner* — Nitin Parekh
(74) *Attorney, Agent, or Firm* — Oblon, McClelland, Maier & Neustadt, L.L.P.

(57) ABSTRACT

A three-dimensional interconnect includes a first substrate bonded to a second substrate, the first substrate including a device layer and a bulk semiconductor layer, a metal pad disposed on the second substrate, an electrically insulating layer disposed between the first and second substrates. The structure has a via-hole extending through the device layer, the bulk semiconductor layer and the electrically insulating layer to the metal pad on the second substrate. The structure has a dielectric coating on a sidewall of the via-hole, and a plasma-treated region of the metal pad disposed on the second substrate. The structure includes a via metal monolithically extending from the plasma-treated region of the metal pad through the via-hole and electrically interconnecting the device layer of the first substrate to the metal pad of the second substrate.

24 Claims, 7 Drawing Sheets

(51) Int. Cl.
*H01L 21/768* (2006.01)
*H01L 25/065* (2006.01)
*H01L 25/00* (2006.01)

(52) U.S. Cl.
CPC .......... *H01L2225/06513* (2013.01); *H01L 2225/06541* (2013.01); *H01L 2224/45147* (2013.01); *H01L 2924/01322* (2013.01); *H01L 2924/10253* (2013.01); *H01L 2924/01015* (2013.01); *H01L 2924/00014* (2013.01)
USPC ............... 257/777; 257/774; 257/E23.011; 257/E23.145

(56) References Cited

U.S. PATENT DOCUMENTS

| | | | |
|---|---|---|---|
| 6,538,333 B2 * | 3/2003 | Kong | 257/777 |
| 6,693,361 B1 * | 2/2004 | Siniaguine et al. | 257/777 |
| 6,906,598 B2 | 6/2005 | Roberson et al. | |
| 7,042,306 B2 | 5/2006 | Roberson et al. | |
| 2002/0081850 A1 | 6/2002 | Kobayashi | |
| 2007/0077761 A1 * | 4/2007 | Lehr et al. | 438/687 |
| 2007/0123051 A1 | 5/2007 | Arghavani et al. | |
| 2008/0132026 A1 | 6/2008 | Coolbaugh et al. | |
| 2009/0068831 A1 | 3/2009 | Enquist et al. | |

* cited by examiner

THREE DIMENSIONAL INTERCONNECT STRUCTURE AND METHOD THEREOF

CROSS REFERENCE TO RELATED APPLICATIONS

This application entitled "DIE BONDING UTILIZING A PATTERNED ADHESION LAYER," U.S. Ser. No. 61/166,388, filed Apr. 3, 2009, the entire contents of which are incorporated herein by reference.

BACKGROUND OF THE INVENTION

1. Field of the Invention

This application is directed to three-dimensional interconnect structures and methods for advanced integrated circuit fabrication.

2. Description of the Related Art

Three-dimensional (3D) integration is an emerging market in which several technology approaches are currently under development or implementation. In the fabrication of electrical interconnects for 3D integration, there are many variables which determine the specific process methods which can be used to make an interconnect of suitably low resistance. A variety of suitable methods have been established for making the interconnect levels required for IC fabrication, including recent copper interconnect technologies. However, for the fabrication of 3D interconnects (such as those going through silicon substrates) the process methods are still being developed by a variety of research groups, and currently there are no industry-standard approaches. Further, the fabrication of 3D interconnects introduces several technical challenges beyond those normally associated with making traditional IC internal interconnects.

Three dimensionally-integrated circuits with multiple interconnected levels have shorter vertical interconnects as opposed to long horizontal lines and therefore benefit from shorter signal propagation delays, lower power consumption and reduced crosstalk noise. Also, the vertical integration of different types of devices (microprocessor, memory, analog, RF, MEMS, optical) in the same 3D structure significantly reduces overall package size.

Some variables which relate to specific designs and applications of the 3D interconnects include: via size and aspect ratio, type of metal pad to be contacted (usually the metal on the underlying substrate, which the 3D via in the top substrate will connect to), and type of metal to be used in forming the 3D interconnect. Further, there are different approaches for the 3D integration which impact the processes used. These approaches may be referred to as "vias-first" or "vias-last." For instance, in the "vias first" approach, vias may be etched into a device substrate to a desired depth, then coated with a dielectric and filled with a via metal prior to thinning of the device substrate and bonding to an underlying base substrate for 3D integration. In such an approach, a metal-to-metal bonding method (such as solder bonding, diffusion bonding, eutectic bonding, or thermocompression bonding) is generally used to achieve both mechanical joining and electrical interconnection of the substrates. In the "vias last" approach, a device substrate is bonded to a base substrate. Deep vias are bored through the device substrate until metal pads on the base substrate are reached. The exposed metal pads and the bored vias have a via-metal deposited thereon and therein, respectively, to form a conducting electrical interconnect between the base substrate and the device substrate. In the vias-last approach, the via etch may have to pass through more than just the substrate layer, but also any bonding layer or additional insulator layers present between the substrates. It may also be necessary to etch a deposited via dielectric selectively from the surface of the exposed metal pads. Further, the surface of the metal pad on the underlying substrate will be exposed to the etch processes used to remove these layers. In the process, this surface can become oxidized, chemically modified, or otherwise contaminated and must be properly cleaned or treated prior to depositing the via metal to form a 3D interconnect of suitably low resistance and high reliability.

In many microelectronic substrate interconnect schemes, tungsten is typically used on a top or bottom of any metallic pads, providing more flexibility in the design space. Conventionally, the problem of providing a suitable electrical contact resistance between tungsten and copper vias have been resolved by high temperatures. However, the need to anneal the substrate to form a low contact resistance contact between the metal pad material and the 3D via metal has limited the vias last technology.

SUMMARY OF THE INVENTION

In one embodiment of the invention, a three-dimensional interconnect structure is provided. The structure having a first substrate bonded to a second substrate, the first substrate including at least a device layer and a bulk semiconductor layer, at least one metal pad disposed on the second substrate, and an electrically insulating layer disposed between the first and second substrates. The structure has a via-hole extending through the device layer, the bulk semiconductor layer and the electrically insulating layer to the at least one metal pad on the second substrate. The structure has a dielectric coating on a sidewall of the via-hole, and a plasma-treated region of the at least one metal pad disposed on the second substrate. The structure includes a via metal monolithically extending from the plasma-treated region of the metal pad through the via-hole and electrically interconnecting the device layer of the first substrate to the metal pad of the second substrate.

In one embodiment of the invention, there is provided a method for forming a three-dimensional interconnect. The method includes bonding a base substrate to a device substrate having at least one metal pad on its surface, etching a via hole through both the first substrate and the bonding layer to expose a metal pad on the second substrate, depositing a dielectric layer in the via, etching an opening in the via dielectric only over the surface of a metal pad at the bottom of the via, plasma treating a region of the metal pad under the opening in the via dielectric; and depositing a metal in the via and onto the exposed metal pad on the surface of the second substrate.

It is to be understood that both the foregoing general description of the invention and the following detailed description are exemplary, and are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
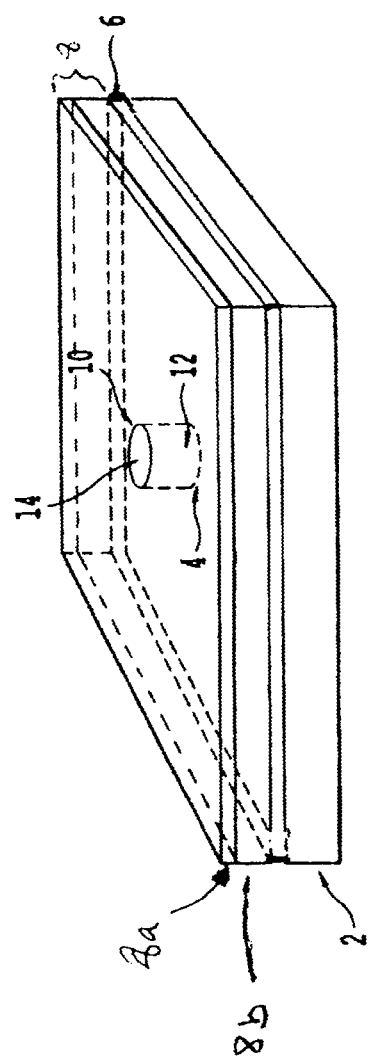
FIG. 1 is a schematic illustration of a three dimensional interconnect according to an embodiment of the present invention.

In a vias-first approach, one forms metal filled vias in a top substrate, polishes from the back, using abrasion, CMP and other known methods, until exposing these vias, then uses a solder joining (or related) method to join two substrates together while at the same time forming the electrical interconnect. In the vias-first approach, the metal pads on the lower substrate (i.e., the un-etched substrate) are not contaminated by the formation of the vias, and are relatively easy to clean by common methods just prior to the joining because the metal pads are exposed on the surface. In other words, the metal to be contacted will likely be on the top surface of the lower substrate. Before joining, the exposed metal pads will be cleaned and prepared for the process of joining and interconnecting it with the upper substrate. This may likely involve an argon backsputter, followed by the deposition and formation of appropriate metals for solder bonding to the 3D via in the upper substrate, or deposition of metals for an alternative metal-to-metal bonding to the upper substrate. Such methods are relatively well established.

In a vias last process such as the vias last process of the invention, the starting chips or substrates may also be lapped and polished before bonding to reduce the thickness of the bulk silicon layer such that the overall thickness of a thinned substrate is in the range of 200 microns to 10 microns. The substrates are then bonded together and interconnects are formed by etching vias in the bonded set of substrates, insulating the vias, and metalizing the vias. In such cases, the interconnection is formed in the bottom of an etched via. As a consequence, the metal pad at the bottom of the via would have been exposed to the plasma processing used to form the via and frequently is contaminated or oxidized on its surface as a result.

In the vias-last approach, as compared to a vias-first approach, it is therefore both more necessary and at the same time more difficult to treat the surface of the metal pad which resides at the base of the via. Indeed, as the aspect ratio of the via increases, cleaning the metal pad becomes even more difficult.

Traditional vertical interconnects are often made with relatively low aspect ratio (typically about 1:1 to about 3:1) vias through oxide dielectric layers. Methods for etching and metalization of such vias are well established. Etching is typically accomplished by reactive ion etching (RIE). The vias do not require additional insulation, since these vias are formed through an oxide layer. A typical interconnect process might involve a sputtered metal film as the via metal, or to act as a "seed layer" that can be later plated with metal to fill the via. In either case, it is the sputtered metal film which forms the electrical contact to the underlying metal. It is common to use an in-situ backsputter process (bombarding the substrate with argon ions) to clean the underlying metal surface prior to deposition of the sputtered via metal. For the formation of 3D vias, it is not uncommon for the aspect ratios to be higher (often from about 4:1 to 10:1, and in some applications greater than 10:1) since the vias are usually going through the entire substrate layer. Given the overall length of such vias, high aspect ratio and nearly vertical (85 to 90 degree) sidewalls are preferred to reduce the area consumed by the cross-section of the via, especially at the upper end.

The increased aspect ratio complicates the etching of the vias, the deposition of insulator and diffusion barrier layers, and the ability to use chemicals or plasma processes to "clean" the underlying metal pad prior to making an electrical contact. Finally, the metalization of high aspect ratio vias also becomes increasingly difficult with an increase in the aspect ratios, since standard sputtered films will not provide sufficient coverage (or conformality) along the sides and bottom of high aspect ratio vias. The coverage of sputtering can be increased by the use of ionized physical vapor deposition (i-PVD), but still i-PVD is not sufficient for aspect ratios much greater than about 5:1. For high aspect ratio vias (>5:1), methods like metal-organic chemical vapor deposition (MOCVD) have been useful in providing high conformality metal films, for example by providing highly conformal (>90%) copper films in vias of aspect ratios exceeding 10:1.

Traditional interconnect materials have primarily included aluminum, tungsten, and more recently, copper. In the formation of 3D interconnects, the higher aspect ratios often eliminate the use of sputtered metals, thus requiring high conformality CVD processes to be used. Research groups have reported the use of CVD materials such as tungsten, polysilicon, and copper for 3D interconnects. U.S. Pat. No. 6,429,126 (the entire contents of which are incorporated herein by reference) describes s chemical vapor deposition process for depositing a tungsten film on a substrate. U.S. Pat. No. 6,498,082 (the entire contents of which are incorporated herein by reference) describes a chemical vapor deposition process for depositing a polysilicon film on a substrate. U.S. Pat. No. 6,509,266 (the entire contents of which are incorporated herein by reference) describes s chemical vapor deposition process for depositing a copper film on a substrate. Considering the deposition temperatures required, the compatibility of those temperatures with the substrates to be interconnected, and the electrical conductivity of the materials, copper has been a common choice for 3D interconnect development. Indeed, the inventors have deposited Cu conformally by MOCVD (as described above) at relatively low temperatures (below 250° C.). Such low temperature capability and the attendant advantages thereof in 3D integration will be of little value if the electrical contact resistance can only be made sufficiently low by a high temperature anneal, for example greater than 300° C.

As described above, microelectronic interconnect materials have historically included primarily aluminum, tungsten, and copper. When copper is used, it is typically used in the upper interconnect levels, i.e., not in those metallization layers immediately closest to the silicon device surface.

When using a vias last approach, the via etch will stop on these underlying metals, and it is frequently necessary to use methods (such as ICP plasma etch described below) to clean the metal pad and then to deposit conformal metal by methods such as MOCVD described below. The type of metal pad to be contacted (W, Al, Cu, etc) impacts the choice of methods for preparing the metal pad surface and for making electrical contact with a sufficiently low resistance (as required for practical application).

In one embodiment, the invention forms very low resistance "vias last" interconnects between Cu filled 3D vias and Cu pads on the underlying substrates. While initially the ICP plasma etching was used to "clean" the Cu pad surface with argon ions alone, it was found that the precursors used in the Cu MOCVD process may also achieve a clean copper surface through in-situ chemical interaction with this surface, just prior to MOCVD deposition. This "self-cleaning" aspect of the Cu MOCVD process eliminated any practical need to have a separate plasma process for cleaning after the plasma via-hole process.

On the other hand, when making interconnects onto W pads, in one embodiment, it is advantageous to use ICP plasma etch treatments to prepare the W pad surface, as the Cu precursors are insufficient in cleaning the W pad surface. Furthermore, the use of Ar was found to be beneficial (through physical sputtering of the W surface) in lowering contact resistance, and the use of a $SF_6$ plasma was also found to be beneficial in lowering contact resistance (presumably through chemical etching of a thin layer of W from the metal pad contact surface).

Referring now to the drawings, wherein like reference numerals designate identical or corresponding parts throughout the several views.

FIG. 1 illustrates a device package 1 formed by an embodiment of the present invention. As shown in FIG. 1, the device package 1 includes a base substrate 2 including at least one contact pad 4 and, optionally, an overlying, electrically insulating passivation layer 6. The passivation layer 6 may also provide a bond between the base substrate 2 and a device substrate 8, after alignment of the substrates 2 and 8. Suitable materials for passivation layer 6 include epoxy, an oxide, a polyimide, a benzocyclobutene (BCB), or a combination thereof.

In one embodiment of the invention, a photo-imagable adhesive layer as described in the above-noted application "DIE BONDING UTILIZING A PATTERNED ADHESION LAYER" is utilized to bond a top die to a bottom die. The photo-imagable adhesive layer is patterned prior to wafer or die bonding, thereby eliminating or reducing many of the bottom-clear problems noted above. For example, a bottom die/wafer has redistributed metal contacts on its top surface. The bottom die is coated with a patternable adhesive such as for example SU8™ to appropriate thickness—dependent on topography, and then the adhesive is soft baked. Details of the coating and developing processes are given below. Optionally, depending on the nature of the die sets being bonded, the patternable adhesive is planarized. Planarization can be an important step since the cross-linked adhesive (i.e., exposed/baked adhesive) has a very high viscosity, and bonding is generally performed below a glass transition temperature of the adhesive. The adhesive can be deposited and patterned using traditional photolithography techniques—coat, expose, post-exposure bake, and develop—to provide openings to the contact on the top surface of the bottom die.

A conventional resist coating apparatus, such as a spin coater, or a meniscus coater, can be used to deposit a film of the adhesive to a desired thickness onto a substrate. The deposited film can then be "prebaked" for example at approximately 95° C. for about 3 minutes, for example. The prebaking step drives solvents from the deposited film in order to partially harden the film for subsequent processes. Following prebaking, the thick film resist can be exposed in a desired pattern by directing exposure energy through a reticle. Exposure of the photo-imageable adhesive can be accomplished with conventional photolithography equipment which provides an appropriate wavelength and dose for the adhesive. A representative UV dose for the previously described resist formulation is about 200 mJ/cm$^2$.

Following exposure, the deposited film resist can be developed to form a pattern of openings. One suitable wet chemical for developing the above resist formulation is a solution of PGMEA (propyleneglycol-monomethylether-acetate). Another suitable wet chemical is a hot (e.g., 105° C.) solution of n-methyl-2-pyrrolidone.

In addition to SU8™, other suitable photo-imageable adhesives for the invention include polymide/epoxy/BCB. One suitable SU8™ resist for the invention is a negative tone, thick film resist sold by Shell Chemical under the trademark EPON RESIN SU8™. This thick film resist includes an epoxy resin, an organic solvent (e.g., gamma-butyloracton), and a photoinitiator. The thick film resist can be deposited to over a thickness range of 1-50 mils. In addition, the thick film resist can be developed (i.e., etched) with high aspect ratio openings having almost vertical sidewalls.

The device substrate 8 may have a device layer 8a and bulk semiconductor layer 8b and include at least one deep via 10 which is bored through the device substrate 8 and the overlying passivation layer 6 to expose the metal contact pad 4. Common materials for contact pad 4 are copper, tungsten, titanium, titanium-tungsten alloy, or a combination thereof. For the sake of simplicity only one deep via 10 is shown in the figures. The sidewalls of the deep via 10 can be insulated with a dielectric prior to filling the via 10. A surface treatment (to be discussed below) is applied to the exposed contact pad to form treated contact pad surface 12. A via-fill metal 14 is formed on the treated metal contact pad surface 12, fills the deep via 10 and monolithically extends to electrically interconnect the metal contact pads of the base substrate to the device layer of the device substrate. The contact pads, prior to formation of the deep via, may either be recessed, exposed, and/or passivated on the base substrate 2. The device substrate 8 has a device layer 8a and a bulk semiconductor layer 8b. The device layer 8a may include microelectronic devices, circuits, interconnects, optical devices, MEMS devices and others built into or on the bulk semiconductor substrate. The bulk semiconductor layer 8b may include a silicon layer, a silicon germanium layer, a III-V semiconductor material layer, a silicon carbide layer and a gallium nitride layer. In one embodiment, the bulk semiconductor layer may include all the remaining material beneath the device layer. Although FIG. 1 shows a single lower substrate (i.e., base substrate 2) bonded to a device substrate 8, in one embodiment, the lower substrate can include a plurality of substrates.

One aspect of a high quality three-dimensional interconnect, achievable by the vias last process of the present invention, is the ability to create low resistance contacts between a via metallization and a metal pad or routing metal layer using low temperature processing, further described below. In one embodiment, the quality of a contact (i.e. its low resistance) depends on a contact pad treatment performed prior to a deposition of a via-fill metal to form the 3-D interconnect. As many Si IC designs include tungsten contact pads and copper vias in multilevel metallization schemes, the invention in one embodiment forms a low resistance contact between contact pads, such as tungsten contact pads, and copper-filled vias. The vias-last technology of the present invention, in one embodiment, uses a novel surface treatment that removes contamination from the tungsten contact pads which would otherwise impede electrical contact to a Cu via-fill metal.

In a working example, a Si wafer with a patterned tungsten fanout metal incorporated in a passivation layer was provided using conventional metallization and patterning techniques. On top of the passivated Si wafer, thin passive Si die were bonded. In this example, arrays of about 65,000 3D interconnects approximately 30 μm tall, 4 μm in diameter, and positioned on a 30 μm pitch exist in the thin passive Si die. In this example, sixty four of the 3-D interconnects were designed to "land" on a tungsten metal pattern such that an electrical resistance of the selected interconnects could be measured using a four probe method.

In this example, vias were bored through the bonded thin Si die and through the passivation layer. An anisotropic reactive ion etch process, using a photoresist mask to define the via openings, was used to form via holes and to remove, in the region of the via openings, the via insulator and the passivation layer (e.g., an epoxy layer used to bond the two substrates and a supplied $SiO_2$ protective layer) on the tungsten metal pattern on the otherwise passivated Si wafer.

Table 1 below shows resultant specific contact resistivity as a function of tungsten contact pad cleaning treatment conditions in this working example. The resistivity values were obtained using dry circuit conditions (i.e., using low applied voltages) to avoid breaking down any potential interface oxides.

TABLE 1

| W Pad Treatment | Via Resistance (<20 mV) | Specific Contact Resistivity ($\Omega\,cm^2$) between Cu wire and W pad |
|---|---|---|
| No pad treatment* | 10-600 Ω | $1 \times 10^{-6}$-$6 \times 10^{-3}$ |
| 30 sec Ar sputter etch | 10-100 mΩ | $<1 \times 10^{-8}$ |
| 30 sec $SF_6$ etch | 10 mΩ | $\sim 1 \times 10^{-9}$ |

*Except for plasma exposures in other steps of the 3-D integration process.

Table 1 indicates that the cleaning treatments of the invention affect contact resistance, permitting in this example low contact resistance for the MOCVD Cu interconnect to tungsten following a 30 sec Ar sputter etch or following a 30 sec $SF_6$ etch. While this treatment was conducted ex-situ to the plasma reactive ion etch process chamber, the treatment could have been performed in-situ or in an adjacent process module. Furthermore, the times given here are not restrictive. The times are set so as not to cause damage to the pad and not remove an excessive amount of the contact pad material. In this example, an inductively coupled plasma (ICP) etcher was used such as for example an ICP Multiplex ASE (Advanced Silicon Etcher) by Surface Technology Systems (STS) with standard rate ICP source. The specific equipment used had a 1 kW RF power source (13.56 MHz) for the coil and a 300 W RF power source (13.56 MHz) for the platen, which are controlled independently of each other. STS ICP system combines a high conductance, high vacuum compatible process chamber with an ICP source to produce a very high ion density at low pressures. Other plasma etchers could be used in the invention, although etch times and recipes would most likely have to be adjusted somewhat from those described below.

Ar Sputter Etch
Pressure 5 mTorr,
Ar flow rate 40 sccm,
Power 500 W coil, 300 W platen
Substrate holder unheated
$SF_6$ Etch:
Pressure 26 mTorr,
$SF_6$ flow rate 130 sccm,
Power 600 W coil, 24 W platen
Substrate holder unheated While not bound to a particular theory, the argon and $SF_6$ etch techniques are believed to remove oxidation, etch residue, and undesired layers from the tungsten contact pad prior to via metal fill. Other suitable chemistries for "cleaning" the tungsten contact pad surface include wet chemistries such as hydrogen peroxide (wet chemical) and/or $CF_4$ and $O_2$ mixtures (plasma). These treatments may need an additional treatment with the above described Ar sputter etch for an abbreviated period of time to remove any nascent tungsten oxide.

In the case of contact pads other than tungsten, the following reactants for the given metal is suitable in various embodiments of the present invention. For aluminum contact pads, a plasma $SiCl_4$ gas could be used. Other agents for aluminum cleaning can include for example $Cl_2$, $BCl_3$, and others, which are used in traditional RIE of Al films. For tungsten silicide contact pads, a plasma $NF_3$ gas could be used. For nickel silicide contact pads, a plasma $NH_3/NF_3$ gas could be used. When the surface is an exposed W contact pad, the contact pad could be plasma treated for example with an Ar or a $SF_6$ plasma, as described above in detail. The ability to properly prepare especially W or Al surfaces for suitable electrical interconnection without high temperature annealing opens up a great deal of flexibility and offers advantages in terms of 3D design and processing. For example, it may allow one to make contact to W or Al pads buried at any level of the interconnect layers of an IC substrate, including the bottom-most metal layers. In particular, the low resistance contacts demonstrated below between Cu and W using the methods of the invention can permit an IC to be designed for 3D using a buried W metal layer which could be placed at any metal level or near the Si interface so that a 3D via could later be etched into the substrate to make contact to the buried W metal layer.

In the working example discussed above, the bonded device substrate had an approximate thickness of 20 μm. The passivatation layer (i.e., the above discussed $SiO_2$ layer) had a thickness of approximately 1000. The diameters of the vias were approximately 3-5 μm.

At the end of the plasma treatment process, the bored via hole structure may be rinsed with water and dried without compromise of the contact resistance. Once the via metal is filled, metallizations from the metallized vias to devices on the bonded substrate can be made. The invention is especially suited for interconnecting integrated circuits that are sensitive to heat. Copper used to form the via metals can be applied at 200° C. or less. The bonding of the device substrates together typically may occur at room temperature or at temperatures below 200° C. using for example using an adhesive bond. Other adhesives or bonding agents could permit bonding at the bonding temperatures of those materials which could be higher or lower than 200° C.

These processes contrast with conventional vias last technology, where low resistance contacts have required high temperatures, such as for example 400-450° C., to form a connection between electrical contacts involving tungsten. However, by way of the invention, a vias last technology with a low temperature budget and a low resistance contact to tungsten can be realized without subjecting the devices on the bonded pair to high temperatures.

Figure 2:
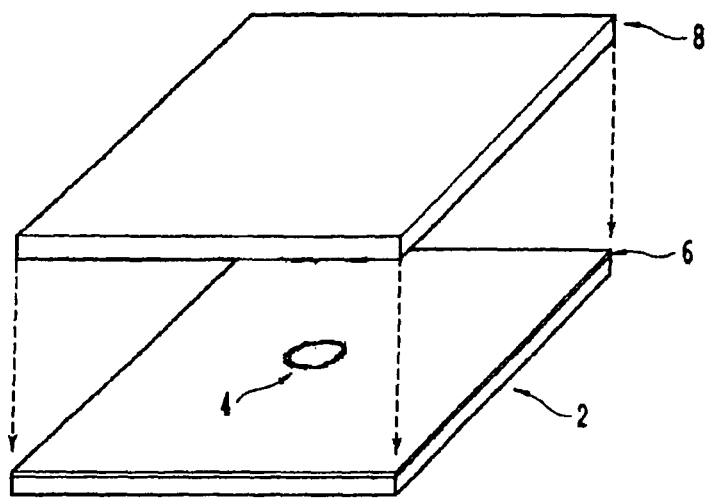
FIG. 2 is a schematic illustration showing a device substrate bonded to a base substrate.
Figure 3:
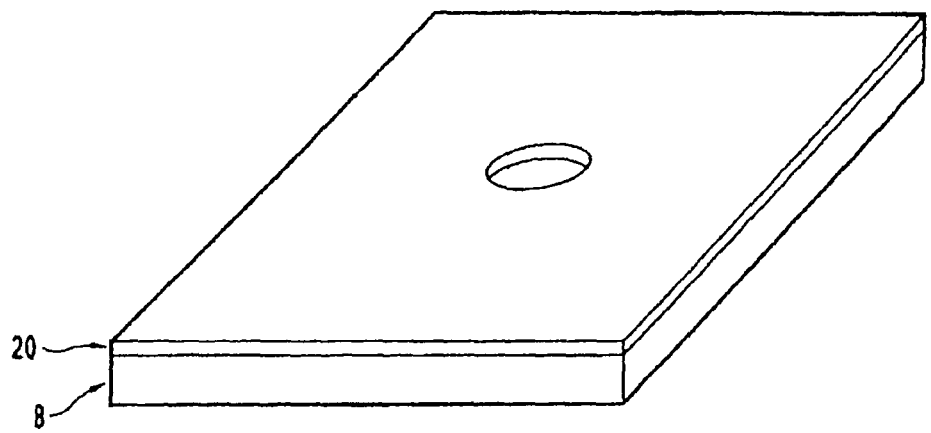
FIG. 3 is a schematic showing the formation of a mask on a top surface of a device substrate.
Figure 4:
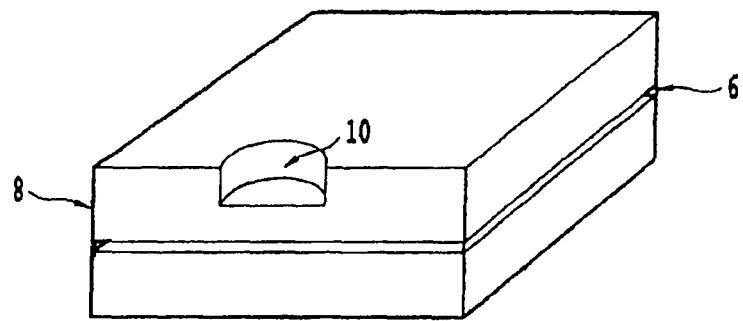
FIG. 4 is a schematic showing the partial formation of vias in a device substrate.

FIGS. 2-6 are schematics showing a process sequence in a vias last process of the present invention. FIG. 2 is a schematic showing a base substrate 2 including at least one contact pad 4 having an overlying passivation layer 6. Substrates 2 and 8 are aligned as shown in FIG. 2, and subsequently bonded together. FIG. 3 is a schematic showing the deposition and patterning of a mask 20 on the top surface of the device substrate 8, which will be used to subsequently open a hole in device substrate 8 to expose contact pad 4. FIG. 4 is a schematic showing a cross-sectional perspective view of the partial formation of a deep via 10 in the device substrate 8.

Figure 5:
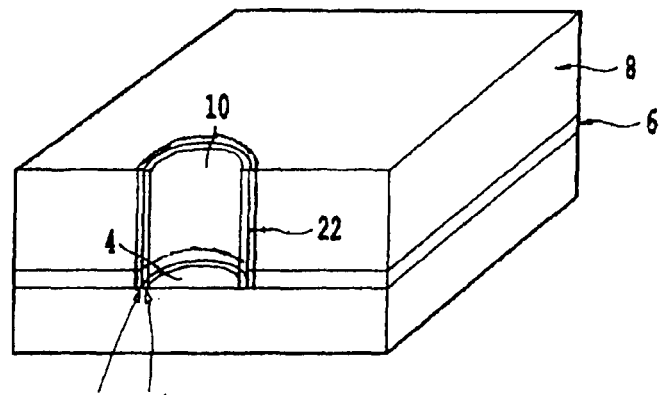
FIG. 5 is a schematic showing the complete formation of vias in a device substrate.

FIG. 5 is a schematic showing a perspective view of the complete formation of deep via 10 through the second device substrate 8 and exposure of the contact pad 4. The via boring in one embodiment utilizes plasma chemistries that are not reactive to the material of the contact pad 4 so to be a self limiting etch process. As shown in FIG. 5, the sidewalls of the deep vias 10 are insulated with a dielectric 22 which may be one of a parylene, a silicon oxide and silicon nitride. After insulating the via walls with dielectric 22, a thin diffusion barrier layer 26 may be optionally applied onto the dielectric layer inside the via hole to reduce diffusion of the via fill material through the insulation layer. The need for such a diffusion barrier may depend on the diffusion properties of the dielectric 22. Another etch step is used to removed any of the dielectric 22 and diffusion barrier 26 on the contact pad 4. While the perspective of FIG. 5 shows the deep vias 10 being formed in a top substrate, the invention is not limited to the deep vias 10 being formed in any particular one orientation of the substrates 2 and 8 shown.

Figure 6:
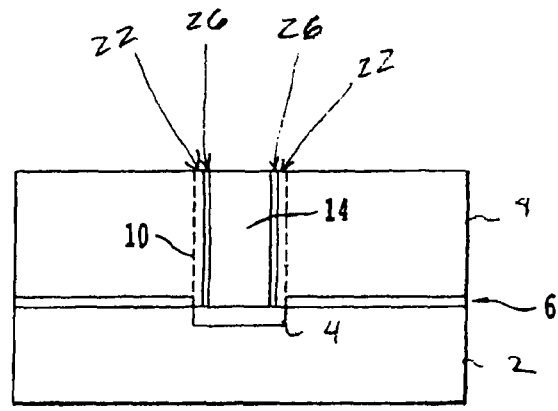
FIG. 6 is a schematic showing the formation of a via-fill metal on a treated contact pad surface.

FIG. 6 is a cross-sectional schematic showing the via-fill metal 14 filled in the via hole 10 and contacting to the treated contact pad surface 12. The dielectric layer 22, coating the inside walls of the via, electrically insulates the fill metal 14 from the semiconductor substrate. Also shown in this embodiment is the optional diffusion barrier 26, though the necessity of such a layer is application dependent. FIG. 6 provides a perspective where the contact pad 4 is relatively close to the surface of base substrate 2. Yet, the invention is not so limited and includes embodiments where the contact pad 4 is buried farther into the bulk of the substrate (e.g., as buried under several planarization and passivation layers).

Figure 7:
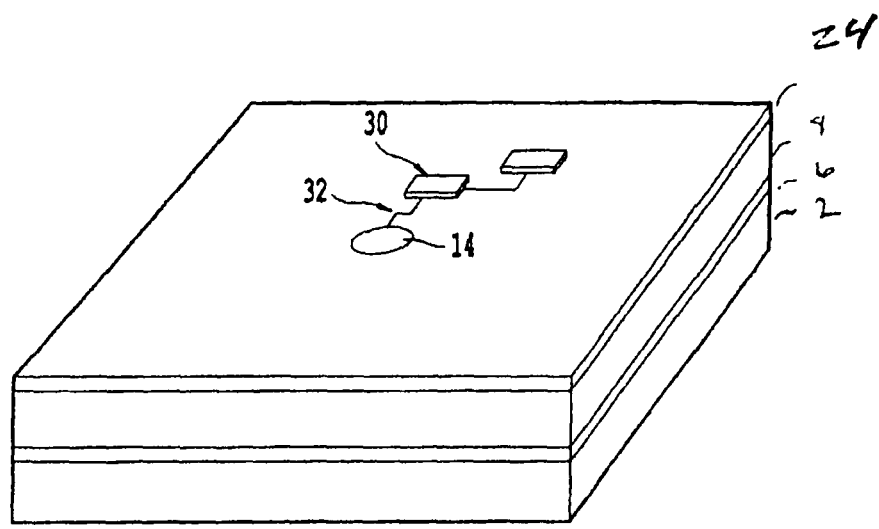
FIG. 7 is a schematic showing the connection of a via-fill metal to devices on the device substrate.

FIG. 7 is a schematic showing the connection of filled vias 14 to devices 30 on the device substrate 8 via lead lines 32 formed on passivation layer 24. While FIG. 7 shows an embodiment where the filled vias 14 are formed from the frontside to connect by lead lines 32 to devices 30 on a "top" of the wafer, in another embodiment of the invention, a through-wafer interconnect can be formed from the backside of the wafer containing electronic devices to the bottom surface of a metal pad. This approach has the benefit of forming the interconnect within the footprint of the pad. In this embodiment, the wafer or die with the through-wafer interconnects thus created can be subsequently bonded to another wafer or die.

Figure 8:
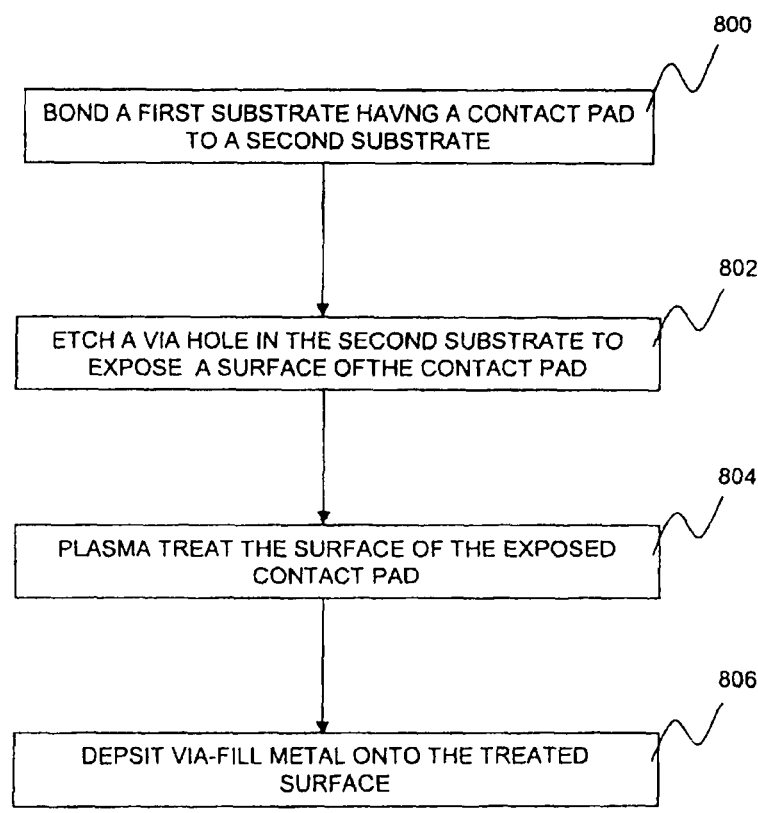
FIG. 8 is a flowchart showing a process according to one embodiment of the present invention.

Thus, one aspect of the invention involves a method for forming a three dimensional wafer-to-wafer interconnect structure as shown in FIG. 8. More specifically, FIG. 8 is a flowchart showing a process according to one embodiment of the present invention. At 800, a base substrate having a metal contact pad is bonded to a device substrate with a bonding layer disposed between the substrates. At 802, a via hole is etched through the device substrate and the bonding layer to expose the metal contact pad of the base substrate. At 804, the surface of the exposed contact pad is plasma treated. At 806, a via-fill metal is deposited in the plasma treated, exposed contact region. As part of the via hole formation process, at 802, a dielectric coating can be deposited on the inside walls of the via to insulate the via from the substrate. Also, after the deposition of the dielectric, a diffusion barrier may optionally be deposited on the inside walls of the via, overlaying the inner surface of the dielectric, to provide a barrier between the via-fill metal and the dielectric. Prior to or concurrently with 804, the dielectric and optional diffusion barrier layers are removed from the surface of the metal contact pad.

Accordingly, the surface of the exposed contact pad is plasma treated in a process separate from the opening process and having a different plasma chemistry from the via-hole opening process to prepare the surface of the contact pad for metallization (e.g., to decrease an electrical resistivity of an interface to be formed between the contact pad and the subsequent via-fill metal). As a result of 804 and 806, a contact resistance between the contact pad and the via-fill metal of less than $10^{-6}$ $\Omega cm^2$ is formed.

For example, the surface can be an exposed tungsten (W) contact pad, an exposed aluminum (Al) contact pad, an exposed Mo pad, and an exposed silicide contact pad. The silicide pads can include silicides such as for example nickel, tungsten, and titanium silicides. When the surface is an exposed W contact pad, the contact pad could be plasma treated for example with an Ar or a $SF_6$ plasma, as described above in detail. When the surface is an exposed Al contact pad, the contact pad would be plasma treated for example with a $SiCl_4$, $BCl_3$, or $Cl_2$ gas or combination thereof. When the surface is an exposed tungsten silicide contact pad, the contact pad could be plasma treated for example with $NF_3$ gas. When the surface is an exposed nickel silicide contact pad, the contact pad could be plasma treated for example with $NH_3/NF_3$ gas. When the surface is an exposed Mo contact pad, the contact pad could be plasma treated for example with $CF_4$ gas.

At 806, copper can be used as the via-fill metal deposited onto the treated contact pad. Other conductive metals and conductive silicides could be used, although at some increase in resistance as compared to copper. At 800, a wafer die can be bonded to the base substrate, the device substrate, or both. At 800, the bonding can occur by way of an adhesive or a solder, or suitable measure by which the base and device substrate remain bonded during the remainder of the process. At 806, the via-fill metal in the via hole can be filled at approximately 200° C. or less, and the via holes can be filed with copper (Cu).

Prior to 806, the bonded substrates can be rinsed with water following the treating.

Furthermore, the process described above, with respect to the base and device substrates, can be extended to an electrical integration of other substrates. For example, a third substrate could be bonded onto the device substrate for further 3D integration. Alternatively, a third substrate could be bonded onto the base substrate at a position in a vicinity of the device substrate (i.e., allowing multiple substrates or device substrates on the base substrate).

Figure 9:
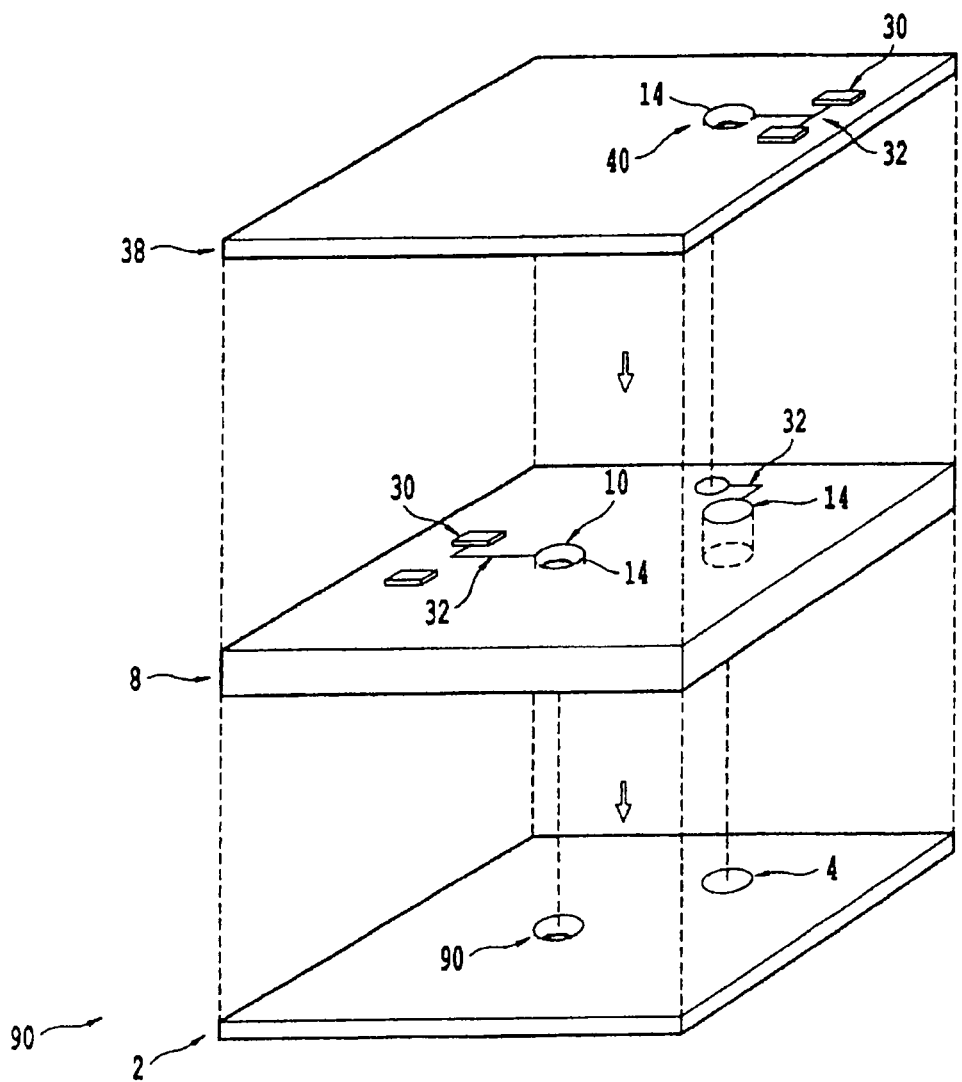
FIG. 9 is an exploded view of a device package according to an embodiment of the present invention.

FIG. 9 illustrates an embodiment where an upper substrate, bonded to a base substrate, includes two device substrates (i.e., a device substrate 8 and a second device substrate 38). FIG. 9 is a an exploded view showing a base substrate 2 including at least one contact pad 4 bonded to a device substrate 8, after alignment of the substrates 2 and 8. A second device substrate 38 is bonded to the device substrate 8, after alignment of the device substrates 8 and 38. It should be understood that a plurality of device substrates can be successively stacked to form the electronics package 90, for example, a third device substrate may be bonded to the second device substrate, and so forth.

The device substrate 8 and/or second device substrate 38 include at least one deep via 10 and at least one shallow via 40, respectively, in which via-fill metal 14 is deposited. Furthermore, the device substrate 8 and/or second substrate 38 include lead lines 32, to connect devices 30 with the deposited via-fill metal 14. A combination of deep via 10, shallow via 40, and/or lead lines 32 may be arranged to form an electrical connection between any two device substrates. For example, the electrical connection may be formed between the device substrate 2 and the second device substrate 38.

For the multiple substrate arrangement, the process described above could be applied in parallel, with the multiple substrates first bonded to the base substrate and having respective sets of via holes in each substrate to align with the contact pads on the base substrate before the exposed contact pads are treated. Some circumstances may use a sequential process (attachment, via hole forming, and treating) for respective ones of the multiple substrates.

Figure 10:
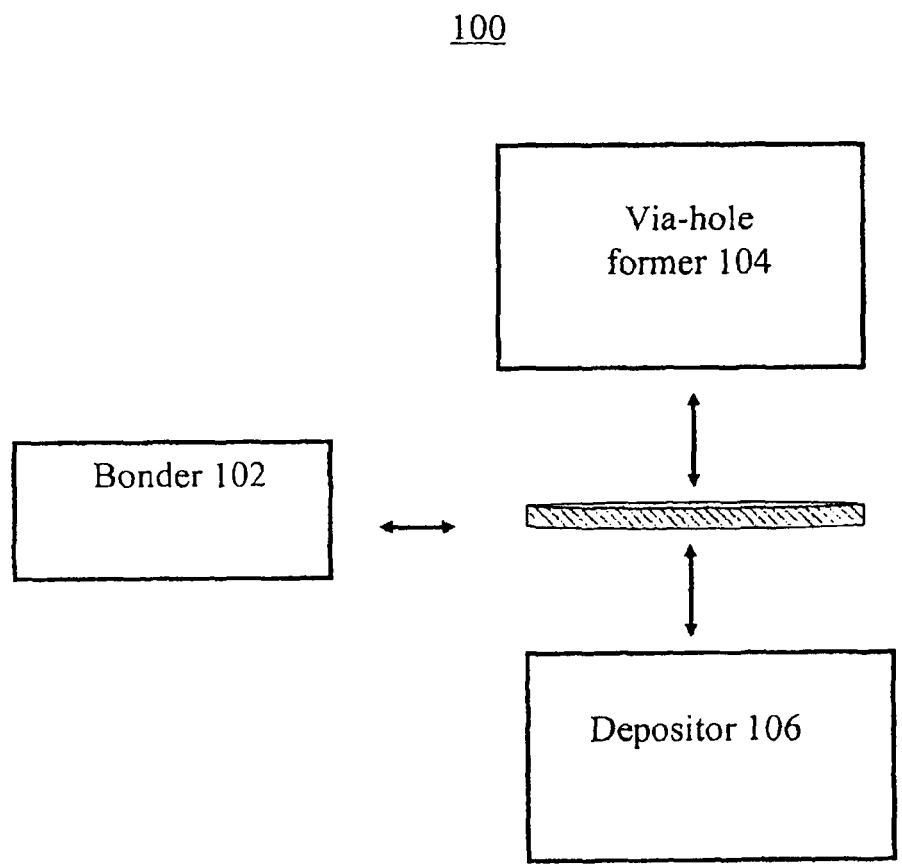
FIG. 10 is a schematic depicting the elements of a system for completing the fabrication of a bonded substrate.

FIG. 10 is a schematic depicting the elements of a system for completing the fabrication of the bonded substrate configurations shown above. The system 100 shown in FIG. 10 is for illustration purposes of various embodiments of the invention. The system in FIG. 10 can include for bonder 102 a pressure/temperature bonder, although other wafer and die bonding equipment can be used. Pressure/temperature bonders and techniques for wafer preparation and handling suitable for the invention are described in U.S. Pat. Appl. Publ. No. 2006/0292823, the entire contents of which are incorporated herein by reference. One suitable bonder is the Suss MicroTec FC-150 device bonder. The system in FIG. 10 can include for via former 104 a photographic mask layout wafer processor and a deep reactive ion etcher. The via former 104 can include for example a UV exposure and developer forming a patterned photoresist mask on the upper substrate for patterning of for example the mask 20 in FIG. 3. One suitable exposure tool is the Suss MA-8 mask aligner. The via former 104 can include for example an inductively coupled plasma etcher. One suitable etcher is a Multiplex Advanced Silicon Etcher by Surface Technology Systems (STS) (Imperial Park, Newport, United Kingdom) with an inductively coupled plasma (ICP) source, as discussed above.

The system in FIG. 10 can include for depositor 106 a Cu electroplating system such as described in U.S. Pat. No. 6,121,149, the entire contents of which are incorporated herein by reference. Examples of suitable electroplating tools are wafer plating cells manufactured by Technic, Inc. Besides electroplating, Cu or other via materials can be deposited in the invention using metal organic chemical vapor deposition (MOCVD) carriers such as for example using hexafluoroacetylacetonate copper vinyltrimethylsilane at a deposition temperature of 180° C. or higher.

The process methods and approaches described above are applicable to a number of 3D integration technologies, but have particular advantages when the 3D integration technologies require for the making 3D interconnects with sufficiently low resistance in high aspect ratio vias. In particular, the process methods and approaches described above have been shown to be particularly suited for cleaning metal pads in high aspect ratio vias with Cu interconnection to for example W pads or Cu pads and followed by for example the deposition of copper via metal by MOCVD to achieve highly conformal copper films at low temperatures.

Numerous modifications and variations of the invention are possible in light of the above teachings. It is therefore to be understood that within the scope of the appended claims, the invention may be practiced otherwise than as specifically described herein.

The invention claimed is:

1. A three-dimensional interconnect structure, comprising:
a first substrate bonded to a second substrate, the first substrate comprising at least a device layer and a bulk semiconductor layer;
at least one metal pad disposed on the second substrate;
an electrically insulating layer disposed between the first and second substrates;
a via-hole extending through the device layer, the bulk semiconductor layer and the electrically insulating layer to the at least one metal pad on the second substrate;
a dielectric coating on a sidewall of the via-hole;
a plasma-treated region of the at least one metal pad disposed on the second substrate; and
a via-metal monolithically extending from the plasma-treated region of the metal pad through the via-hole and electrically interconnecting the device layer of the first substrate to the at least one metal pad of the second substrate.

2. A structure according to claim 1, wherein the first and second substrates include microelectronic devices, microelectronic circuits, optical devices or MEMS devices.

3. A structure according to claim 1, wherein the device layer includes microelectronic devices, microelectronic circuits, optical devices or MEMS devices.

4. A structure according to claim 1, wherein the bulk semiconductor layer comprises a thinned substrate having a thickness less than 100 microns.

5. A structure according to claim 1, wherein a surface of the metal pad on the second substrate comprises at least one of copper, tungsten, aluminum, titanium, titanium nitride, titanium-tungsten alloy, titanium-silicide, or a combination thereof.

6. A structure according to claim 1, wherein the electrically insulating layer comprises at least one of an epoxy, an oxide, a polyimide, a benzocyclobutene, or a combination thereof.

7. A structure according to claim 1, wherein the via-hole etched through the first substrate has an aspect ratio greater than 3:1.

8. A structure according to claim 1, wherein the via-hole etched through the first substrate has a sidewall angle greater than 85 degrees.

9. A structure according to claim 1, wherein the dielectric coating in the via comprises at least one of a parylene, a silicon oxide, and silicon nitride.

10. A structure according to claim 1, wherein a diffusion barrier layer is located between the via-metal and the dielectric coating.

11. A structure according to claim 1, wherein the via metal is copper, tungsten, polysilicon, or a combination thereof.

12. A structure according to claim 1, wherein the device layer is apart from the semiconductor bulk layer.

13. A structure according to claim 1, wherein the device layer is included in the semiconductor bulk layer.

14. A structure according to claim 1, wherein the bulk semiconductor layer comprises at least a silicon layer, a silicon germanium layer, a III-V semiconductor material layer, a silicon carbide layer and a gallium nitride layer.

15. An electronics package comprising:
a first substrate having at least one refractory contact pad;
a second substrate bonded to the first substrate and including electronic devices;
a via extending through the second substrate to the contact pad of the first substrate
a via-fill metal disposed in the via and contacting the at least one contact pad; and
a plasma-treated refractory surface interface between the via-fill metal and the contact pad.

16. The package of claim 15, wherein the plasma-treated refractory surface interface has a contact resistivity of less than $10^{-6}$ Ω-cm.

17. The package of claim 15, further comprising:
at least one metallization channel formed on an area of the second substrate and connecting the via-fill metal to at least one of the electronic devices.

18. The package of claim 15, further comprising a third substrate bonded to the second substrate.

19. The package of claim 15, further comprising a third substrate bonded to the first substrate adjacent the second substrate.

20. The package of claim 15, wherein the contact pad comprises at least one of tungsten, aluminum, molybdenum, and silicide.

21. The package of claim 15, wherein the via-fill metal comprises copper.

22. The package of claim 15, wherein the first and second substrates are bonded together by at least one of an adhesive and a solder bonding.

23. The package of claim 15, wherein the via has an aspect ratio of height to width ranging from 4:1 to 10:1.

24. An electronics package comprising:
a first substrate having at least one contact pad;
a second substrate bonded to the first substrate and including electronic devices;
a via having an aspect ratio of height to width ranging from 4:1 to 10:1, and extending through the second substrate to the contact pad of the first substrate
a via-fill metal disposed in the via and contacting the at least one contact pad; and
a plasma-treated surface interface between the via-fill metal and the contact pad.

\* \* \* \* \*